(12) United States Patent
Won et al.

(10) Patent No.: US 7,008,837 B2
(45) Date of Patent: Mar. 7, 2006

(54) METHOD OF MANUFACTURING CAPACITOR BY PERFORMING MULTI-STEPPED WET TREATMENT ON SURFACE OF ELECTRODE

(75) Inventors: Seok-jun Won, Seoul (KR); Jung-hee Chung, Seoul (KR); Yong-kuk Jeong, Seoul (KR); Se-hoon Oh, Asan (KR); Dae-jin Kwon, Seoul (KR); Cha-young Yoo, Suwon (KR)

(73) Assignee: Samsung Electronics, Co., Ltd., (KR)

( * ) Notice: Subject to any disclaimer, the term of this patent is extended or adjusted under 35 U.S.C. 154(b) by 0 days.

(21) Appl. No.: 10/776,053

(22) Filed: Feb. 11, 2004

(65) Prior Publication Data

US 2004/0171212 A1    Sep. 2, 2004

(30) Foreign Application Priority Data

Feb. 27, 2003   (KR) ...................... 10-2003-0012326

(51) Int. Cl.
*H01L 21/8242* (2006.01)

(52) U.S. Cl. ...................... 438/239; 438/240; 438/243; 438/253; 438/386; 438/396; 438/745

(58) Field of Classification Search ................ 438/210, 438/239, 240, 243, 253, 386, 396, 745, 749, 438/750, FOR. 125, FOR. 220, FOR. 430, 438/FOR. 130
See application file for complete search history.

(56) References Cited

U.S. PATENT DOCUMENTS

| 6,010,942 | A | * | 1/2000 | Chien et al. ................. 438/396 |
| 6,013,549 | A | * | 1/2000 | Han et al. .................... 438/253 |
| 6,215,143 | B1 | * | 4/2001 | Han et al. .................... 257/309 |
| 6,287,910 | B1 | * | 9/2001 | Lee et al. .................... 438/240 |
| 6,372,572 | B1 | * | 4/2002 | Yu et al. ..................... 438/241 |
| 6,403,431 | B1 | * | 6/2002 | Chung et al. ................ 438/296 |
| 6,670,663 | B1 | * | 12/2003 | Hwang et al. .............. 257/296 |
| 2001/0005631 | A1 | * | 6/2001 | Kim et al. ................... 438/689 |
| 2001/0029113 | A1 | * | 10/2001 | Kunitomo et al. ......... 438/785 |
| 2003/0008469 | A1 | * | 1/2003 | Hwang et al. .............. 438/396 |
| 2003/0017686 | A1 | * | 1/2003 | Wada ........................ 438/586 |

FOREIGN PATENT DOCUMENTS

| JP | 08-031837 | 2/1996 |
| KR | 2000-0039607 | 7/2000 |

* cited by examiner

*Primary Examiner*—George Fourson
*Assistant Examiner*—Joannie Adelle Garcia
(74) *Attorney, Agent, or Firm*—Mills & Onello, LLP (57) ABSTRACT

In a method of manufacturing a capacitor by performing a multi-stepped wet treatment on the surface of a metal electrode, a lower metal electrode of a capacitor is formed, and a primary wet treatment is performed on the surface of the lower metal electrode to remove unwanted surface oxides that may exist on the surface of the lower metal electrode. A secondary wet treatment is then performed on the surface of the lower metal electrode by using a different etchant than the etchant used in the primary wet treatment, in order to remove unwanted surface organic materials that may exist on the surface of the lower metal electrode. A dielectric layer is then formed on the lower metal electrode using a high-k dielectric material. An upper metal electrode is formed on the dielectric layer.

26 Claims, 7 Drawing Sheets

PARTICLE

WATER MARK

METHOD OF MANUFACTURING CAPACITOR BY PERFORMING MULTI-STEPPED WET TREATMENT ON SURFACE OF ELECTRODE

This application claims the priority of Korean Patent Application No. 2003-12326, filed on Feb. 27, 2003, in the Korean Intellectual Property Office, the disclosure of which is incorporated herein by reference in its entirety.

BACKGROUND OF THE INVENTION

1. Field of the Invention

The present invention relates to the manufacture of a semiconductor device, and more particularly, to a method of manufacturing a metal-insulator-metal (MIM) capacitor by applying a multi-stepped wet treatment to the surface of a metal electrode of the capacitor in order to improve the characteristics of the capacitor.

2. Description of the Related Art

With the increased integration density and advanced performance of semiconductor devices (e.g., DRAM devices), the design rule of such devices is being markedly reduced. Thus, various methods for manufacturing capacitors that occupy a smaller area of the device and having a larger capacitance have been proposed. One of those methods involves the manufacture of MIM capacitors.

A typical method of forming an MIM capacitor comprises forming a lower metal electrode, forming a dielectric layer, performing a thermal treatment, and forming a metal upper electrode. Here, before the dielectric layer is formed, the lower metal electrode may be placed under certain processes that cause it to suffer from environmental damage. As a result, the processes and related circumstances affect the characteristics of the completed capacitor. That is, exposure conditions, such as atmospheric environment and exposure time, under which the lower metal electrode is placed prior to formation of the dielectric layer, may degrade the characteristics of the capacitor.

In addition, certain processes that are performed prior to the formation of the dielectric layer may degrade the characteristics of the competed capacitor. For example, node separation, which is performed subsequent to formation of the lower electrode, may cause moisture absorption into the surface of the metal electrode. Also, unwanted oxides (e.g., native oxide) may be generated on the surface of the lower metal electrode due to the oxidative environment. Also, organic materials may be absorbed on the metal electrode. As a result of these effects, a junk layer, or junction layer, containing oxygen or carbon is generated on the surface of the metal electrode. This junk layer exhibits intermediate properties between the properties of a metal and a dielectric material and thus is a primary contribution to degradation of the characteristics of the capacitor.

Since the foregoing junk layer increases equivalent oxide thickness and deteriorates interfacial characteristics between an electrode and a dielectric layer, the dielectric layer cannot be properly deposited. Accordingly, the junk layer should be removed during the manufacture of capacitors.

SUMMARY OF THE INVENTION

The present invention provides a method of manufacturing an MIM capacitor by adopting a multi-stepped wet treatment as a cleaning process to effectively remove a junction layer that may exist between a lower metal electrode and a dielectric layer.

In accordance with one aspect of the present invention, there is provided a method of manufacturing a capacitor, comprising forming a lower metal electrode of a capacitor; performing a primary wet treatment on the surface of the lower metal electrode to remove unwanted surface oxides that may exist on the surface of the lower metal electrode; performing a secondary wet treatment on the surface of the lower metal electrode by using a different etchant than the etchant used in the primary wet treatment to remove unwanted surface organic materials that may exist on the surface of the lower metal electrode; forming a dielectric layer on the lower metal electrode using a high-k dielectric material; and forming an upper metal electrode on the dielectric layer.

The primary wet treatment may be performed using an etchant containing HF, LAL, SC1, or a combination thereof, and the secondary wet treatment is performed using an etchant containing $H_2SO_4$.

The primary wet treatment may be performed using an etchant containing HF, LAL, SC1, or a combination thereof, and the secondary wet treatment is performed using an etchant containing ozone water.

The primary wet treatment may be performed using an etchant containing LAL, and the secondary wet treatment is performed using an etchant containing $H_2SO_4$.

Alternatively, the primary wet treatment may be performed using an etchant containing SC1, and the secondary wet treatment may be performed using an etchant containing $H_2SO_4$. Here, the SC1 is used as the etchant at a temperature ranging from about 30° C. to 50° C.

In accordance with another aspect of the present invention, there is provided a method of manufacturing a capacitor, comprising forming a lower metal electrode of a capacitor; performing a primary wet treatment on the surface of the lower metal electrode; performing a secondary wet treatment on the surface of the lower metal electrode using an etchant containing LAL; performing a third wet treatment on the surface of the lower metal electrode using an etchant containing ozone water; forming a dielectric layer on the surface of the lower metal electrode using a high-k dielectric material; and forming an upper metal electrode on the dielectric layer.

The primary wet treatment is performed for about 1 minute to 10 minutes using as an etchant a HF diluted with deionized water in a ratio of 1:200. Here, the secondary wet treatment is performed for about 5 seconds to 50 seconds.

In accordance with yet another aspect of the present invention, there is provided a method of manufacturing a capacitor, comprising forming a lower metal electrode of a capacitor; performing a primary wet treatment on the surface of the lower metal electrode using an etchant containing HF; performing a secondary wet treatment on the surface of the lower metal electrode using an etchant containing LAL; performing a third wet treatment on the surface of the lower metal electrode using an etchant containing $H_2SO_4$; forming a dielectric layer on the lower metal electrode using a high-k dielectric material; and forming an upper metal electrode on the dielectric layer.

The third wet treatment may be performed using the $H_2SO_4$-containing etchant further containing $H_2O_2$ at a temperature ranging from about 70° C. to 90° C.

Meanwhile, the lower metal electrode may be formed of titanium nitride, tantalum nitride, tungsten nitride, platinum, or ruthenium, and the upper metal electrode is formed of titanium nitride, tantalum nitride, tungsten nitride, platinum, or ruthenium. For example, the lower metal electrode and the upper metal electrode are formed of titanium nitride.

Also, the forming of the lower metal electrode may comprise forming a molding layer; forming a mold having a recess by patterning the molding layer; forming a lower metal electrode layer having a recess along an inner surface of the recess of the mold; forming a sacrificial layer to fill the recess of the lower metal electrode layer; forming a lower metal electrode by separating the lower metal electrode layer by planarizing the sacrificial layer and the lower metal electrode layer until the top surface of the mold layer is exposed; and selectively removing the remaining sacrificial layer. Here, the separation of the lower metal electrode layer comprises planarizing the lower metal electrode layer using chemical mechanical polishing.

According to the present invention, a multi-stepped wet treatment is performed on the surface of the lower metal electrode, thereby improving interfacial characteristics between the lower metal electrode and the dielectric layer. Thus, the performance characteristics, most notably the leakage current characteristic, of the MIM capacitor, can be effectively improved.

BRIEF DESCRIPTION OF THE DRAWINGS

The above object and advantages of the present invention will become more apparent by describing in a detail preferred embodiments thereof with reference to the attached drawings in which.

DETAILED DESCRIPTION OF PREFERRED EMBODIMENTS

In an embodiment of the present invention, a multi-stepped wet treatment using different wet etchants is carried out to clean a lower metal electrode of an MIM capacitor. Thus, the multi-stepped wet treatment improves not only interfacial characteristics between the lower metal electrode and the dielectric layer but also the performance characteristics of the resulting MIM capacitor.

Prior to formation of the capacitor dielectric layer, a multi-stepped wet cleaning process or wet treatment using different wet etchants is performed on the surface of the lower metal electrode. Here, the wet etchants are used for different purposes.

A junk layer, which may be generated or otherwise may exist on the surface of the lower metal electrode, is formed of oxides, organic materials, or particles generated in the previous process steps. Accordingly, a combination of the wet etchants, which is used for the wet treatment of the metal electrode, should operate effectively on each of the oxides, the organic materials, and particles. Also, some wet etchants can effectively remove certain materials, such as particles, but may cause side effects, such as water marks on the resultant structure. Therefore, a multi-stepped wet treatment or cleaning process using a combination of different wet etchants should be capable of minimizing the side effects and maximizing cleaning effects.

Before the embodiments of the present invention are described in detail, a process of manufacturing a capacitor of a semiconductor device will be briefly described. In the following process of manufacturing a capacitor, a multi-stepped wet treatment according to the present invention is carried out following formation of the underlying metal electrode and prior to formation of the dielectric layer.

1. A Method of Manufacturing a Capacitor According to the Present Invention

FIGS. 1 through 6 are sectional views illustrating a method of manufacturing a capacitor according to an embodiment of the present invention in which a multi-stepped wet treatment is performed on the surface of an electrode.

Figure 1:
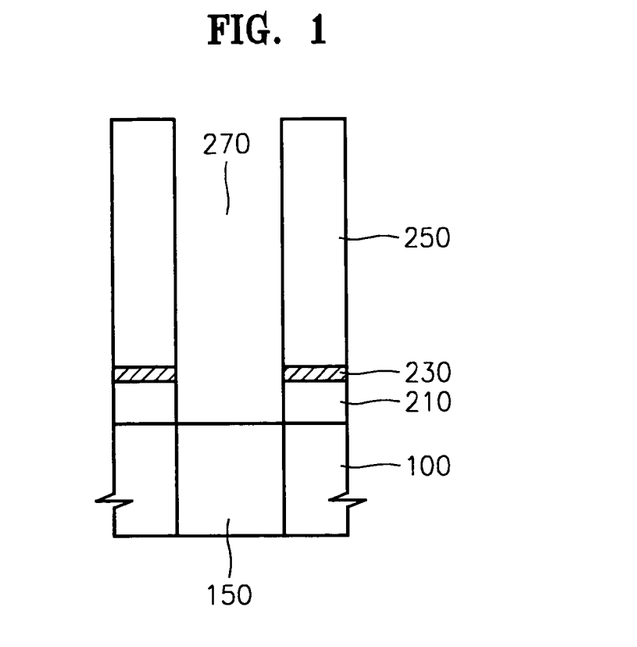
FIGS. 1 through 6 are sectional views illustrating a method of manufacturing a capacitor according to an embodiment of the present invention in which a multi-stepped wet treatment is performed on the surface of an electrode.

Referring to FIG. 1, a mold is formed to provide a lower electrode of the capacitor in a 3-dimensional shape., Specifically, a conductive contact 150 (e.g., a buried contact (BC)) is formed to penetrate an insulating layer 100 in order to electrically connect a semiconductor substrate (not shown) with the capacitor.

Thereafter, an electrode supporting layer 210 is formed using an insulating material such as silicon oxide, and an etch stop layer 230 is formed using a material, such as silicon nitride, having an etch selectivity with respect to silicon oxide. The etch stop layer 230 is formed to control the amount of etching performed during the etch process for forming the mold. A mold layer 250 for the mold is formed on the etch stop layer 230 by using an insulating material such as silicon oxide. Next, the mold layer 250 is selectively etched, thereby forming an opening 270 that exposes the underlying conductive contact 150.

Figure 2:
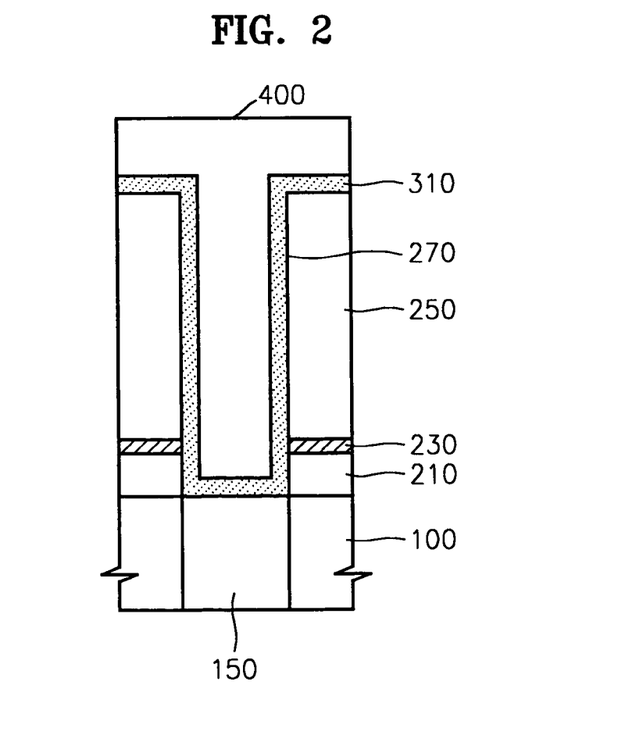

Referring to FIG. 2, a lower metal electrode layer 310 is formed along the profile of the opening 270. The lower metal electrode 310 is formed of a material that is adequate for an MIM capacitor, for example, metal nitride such as titanium nitride (TiN), tantalum nitride (TaN), and tungsten nitride (WN), noble metal such as platinum (Pt) and ruthenium (Ru), or a conductive oxide thereof. Alternatively, the lower metal electrode layer 310 may be formed of metal such as tungsten. Most preferably, the lower metal electrode layer 310 is formed of metal nitride, such as TiN, TaN, and WN, to maximize the advantageous effects of the multi-stepped wet treatment according to the present invention.

After the lower metal electrode layer 310 is formed to have a recess as shown in FIG. 2, a sacrificial layer 400 is formed to fill the recess. The sacrificial layer 400 is formed using an easily removable material to facilitate node separation of the lower electrode layer 310. For example, the sacrificial layer 400 is formed of flowable oxide (FOX) or undoped silicate glass (USG), which has a much higher etch rate than that of the mold layer 250. Alternatively, the sacrificial layer 400 may be formed of photoresist material.

Figure 3:
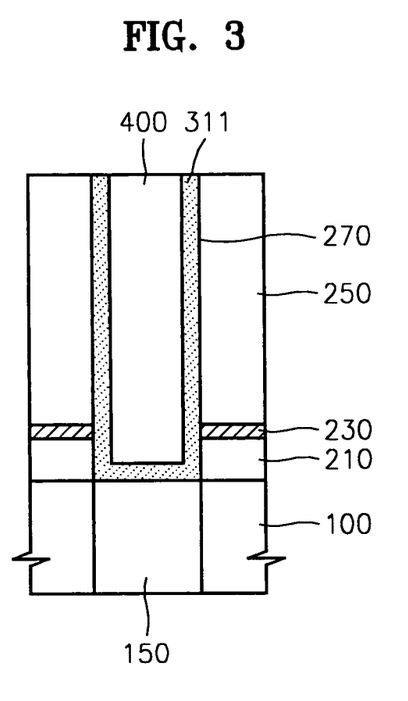

Referring to FIG. 3, the lower metal electrode layer 310 is planarized and then separated into individual electrodes. Here, the sacrificial layer 400 may be etched back before the lower metal electrode layer 310 is planarized. If the sacrificial layer 400 is formed of silicon oxide, it may be etched back using a fluorine-related etch gas such as $C_4F_6$. Alternatively, the sacrificial layer 400 may be etched by chemical mechanical polishing (CMP) using slurry for polishing oxide. If the sacrificial layer 400 is formed of photoresist material, an $O_2$-plasma or $O_3$-containing gas may be used as an etch gas.

If portions of the lower metal electrode layer 310, which are disposed on the mold layer 250, are exposed by etching back or planarizing the sacrificial layer 400, the exposed portions are selectively removed by CMP or dry etching to separate the lower metal electrode layer 310 into individual lower metal electrodes 311.

Figure 4:
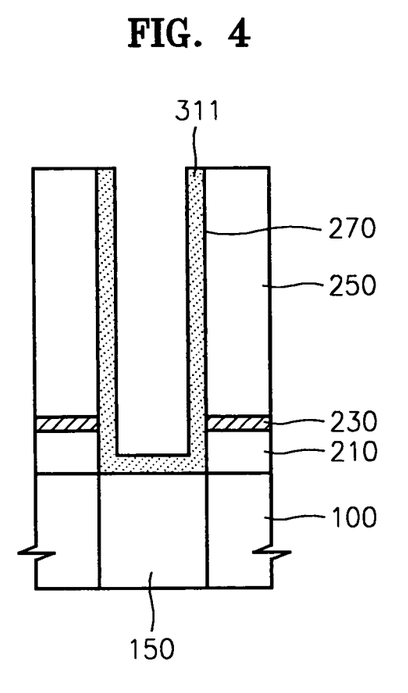

Referring to FIG. 4, the remaining sacrificial layer (400 of FIG. 3) is selectively removed. Here, if a wet etch process is used to remove the remaining sacrificial layer 400 or if the sacrificial layer 400 is formed of photoresist material, the sacrificial layer 400 is selectively removed using $O_2$-plasma or an $O_3$-containing gas.

Figure 5:
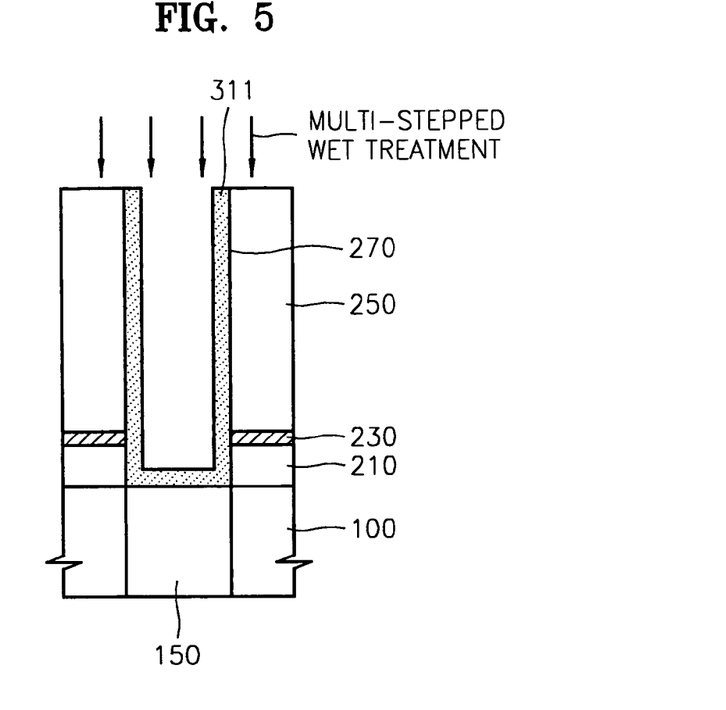

Referring to FIG. 5, a multi-stepped wet treatment is performed on the surface of the lower metal electrode 311, which is exposed by removing the sacrificial layer 400. A junk layer may exist on the surface of the lower metal electrode 311. The junk layer may include contaminants generated during the previous steps and may contain oxides such as native oxide caused by exposure of the lower metal electrode 311 to atmosphere. To remove the junk layer, which may degrade the characteristics of the resulting capacitor, the present embodiment utilizes a multi-stepped wet treatment to effectively clean the lower metal electrode 311, prior to formation of the upper electrode.

The multi-stepped wet treatment selectively uses wet etchants for different purposes. Each wet etchant is selected to be adequate for removing each of main components of the junk layer, such as surface oxides and surface organic materials.

For example, since the surface oxides are generated by exposure of the lower metal electrode to atmosphere or by formation of the sacrificial layer 400, the wet etchants used for removing the surface oxides may be, for example, HF, LAL($NH_4F+HF+H_2O$), standard cleaning 1 (SC1) or a combination thereof.

By using HF diluted with deionized water (DIW) in a ratio of about 1:200, a wet cleaning process or etch process may be carried out for about 1 to 10 minutes. LAL, which is obtained by diluting an etchant mixture of $NH_4F$ and HF with DIW, may be used for about 5 to 55 seconds. Also, in the SC1 process including $NH_4OH$ processing and $H_2O_2$-wet treating, if the lower metal electrode 311 is formed of TiN, the TiN layer may become melted by the SC1. Therefore, a SC1 wet etch process or cleaning process can be carried out for 1 to 10 minutes at a low temperature of about 30° C. to 50° C., preferably, about 40° C. Diluting the etchants with water in appropriate ratios may be preferable. For example, a ratio of $NH_4OH$ to $H_2O_2$ to $H_2O$, used in the SC1, is about 1:1:5.

Meanwhile, these wet etchants can remove particles remaining on the surface of the lower metal electrode 311. The presence of these particles is closely associated with the resulting yield of the semiconductor devices or chips. Certain combinations of the wet etchants enable very effective removal of the particles. The removal of the particles by the wet etchants will be described in more detail later.

Meanwhile, as described above, the junk layer may not only contain the surface oxides, but also surface organic materials (contaminants) and the like. To enhance removal of the surface organic materials, after the foregoing surface oxides are removed, a wet etch process or wet cleaning process using other wet etchants, for example, $H_2SO_4$ or ozone water, is further carried out on the surface of the lower metal electrode 311.

If $H_2SO_4$ is used, $H_2O_2$ may be further added to the $H_2SO_4$. $H_2SO_4$ or an etchant mixture of $H_2SO_4$ and $H_2O_2$ is diluted with DIW and then used in the wet cleaning process. If $H_2O_2$ is added to $H_2SO_4$, O— may combine with C into $CO_2$ to facilitate removal of organic materials. If the lower metal electrode 311 is treated by $H_2SO_4$ or ozone water at a high temperature, the metal layer may be seriously attacked. Accordingly, the treatment using $H_2SO_4$ or ozone water is preferably performed at a temperature of about 100° C., preferably about 70° C. to 80° C.

The multi-stepped wet treatment may comprise removal of the surface oxides followed by removal of the surface organic materials. Alternatively, the surface organic materials may be removed prior to, or during, removal of the surface oxides.

To sum up, the multi-stepped wet treatment of the present invention employs one of combinations of different wet etchants. Representative combinations are as follows. Firstly, a primary wet treatment is performed using HF, LAL, SC1, or a combination thereof and then a secondary wet treatment is performed using ozone water. Secondly, a primary wet treatment is performed using LAL and then a secondary wet treatment is performed using $H_2SO_4$. Thirdly, a primary wet treatment is performed using HF, a secondary wet treatment is performed using LAL, and then a third wet treatment is performed using $H_2SO_4$. Fourthly, a primary wet treatment is performed using HF, a secondary wet treatment is performed using LAL, and then a third wet treatment is performed using ozone water. Fifthly, a primary wet treatment is performed SC1 and then a secondary wet treatment is performed using $H_2SO_4$.

Figure 6:
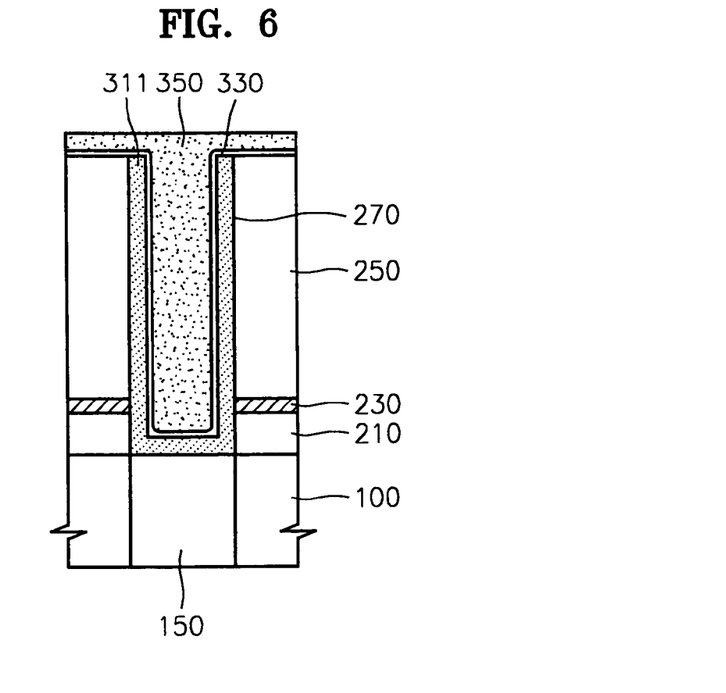

Referring to FIG. 6, after the lower metal electrode 311 is subjected to the multi-stepped wet treatment, a dielectric layer 330 and an upper electrode 350 are formed on the lower metal electrode 311, thereby completing a capacitor. The dielectric layer 330 may be formed of a high-k dielectric material, such as tantalum oxide ($Ta_2O_5$), aluminium oxide ($Al_2O_3$), hafnium oxide ($HfO_2$), lanthanum oxide ($LaO_2$), zirconium oxide ($ZrO_2$), titanium oxide ($TiO_2$), PZT, BST, ST, and SBT, and a combination thereof. These high-k dielectric materials may be deposited using CVD, PVD, or atomic layer deposition (ALD). Thereafter, a thermal treatment such as $O_2$-annealing may be further performed.

Thereafter, the upper electrode 350 is formed on the dielectric layer 330 using a conductive metal material. Thus, the upper electrode 350 is formed, for example, of a metal nitride such as titanium nitride (TiN), tantalum nitride (TaN), and tungsten nitride (WN), a noble metal such as platinum (Pt) and ruthenium (Ru), or a conductive oxide.

2. Effects of the Multi-Stepped Wet Treatment According to the Present Invention FIG. 7 is a graph showing drop in leakage current of a capacitor according to the embodiment of the present invention in which the primary wet treatment using HF is followed by the secondary wet treatment using $H_2SO_4$.

Figure 7:
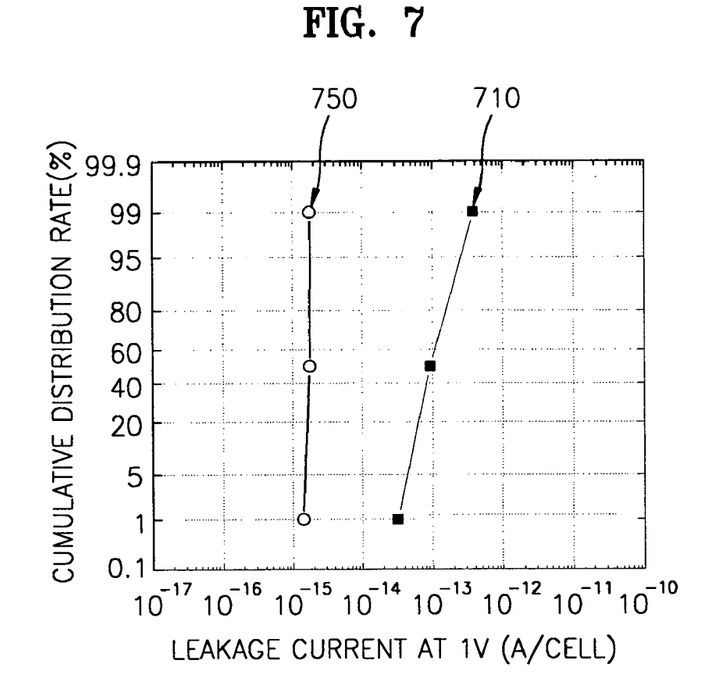
FIGS. 7 through 9 are graphs showing a drop in leakage current of a capacitor manufactured according to the method of the present invention in which a multi-stepped wet treatment is performed.

Referring to FIG. 7, leakage current in case 750 where the primary wet treatment using HF followed by the secondary wet treatment using $H_2SO_4$ was between one and two orders of magnitude less than that in case 710 where only a HF wet treatment was performed. That is, interfacial characteristics between the lower electrode and the dielectric layer were improved as a result of the method of the present invention. In particular, it is seen in FIG. 7 that organic materials could be effectively removed through the secondary wet treatment using $H_2SO_4$ to further improve the performance of the capacitor.

Figure 8:
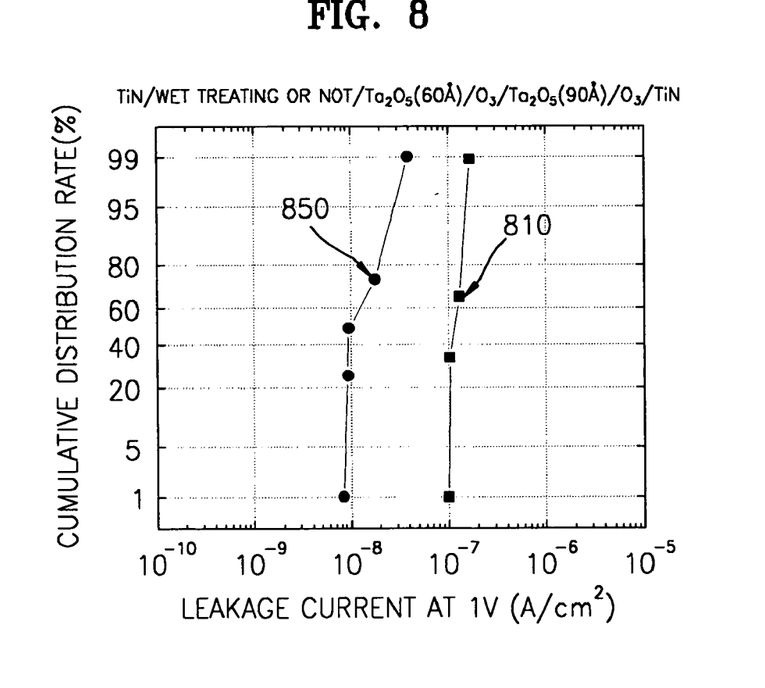

FIG. 8 is a graph showing a drop in leakage current of a capacitor according to the embodiment of the present invention in which an $H_2SO_4$ wet treatment is performed on the capacitor.

The results of FIG. 8 show measured leakage current of sample capacitors, which were formed by forming a TiN lower electrode, wet treating or not, forming a 60-Å thick $Ta_2O_5$ layer, $O_3$-annealing, forming a 60-Å thick $Ta_2O_5$ layer, $O_3$-annealing, and forming a TiN upper electrode. The wet treatment was performed using $H_2SO_4$. As shown in FIG. 8, the leakage current in case 850 where the $H_2SO_4$ wet treatment was performed for about 20 minutes was between one and two orders of magnitude less than that in case 810 where the wet treatment was not performed.

Figure 9:
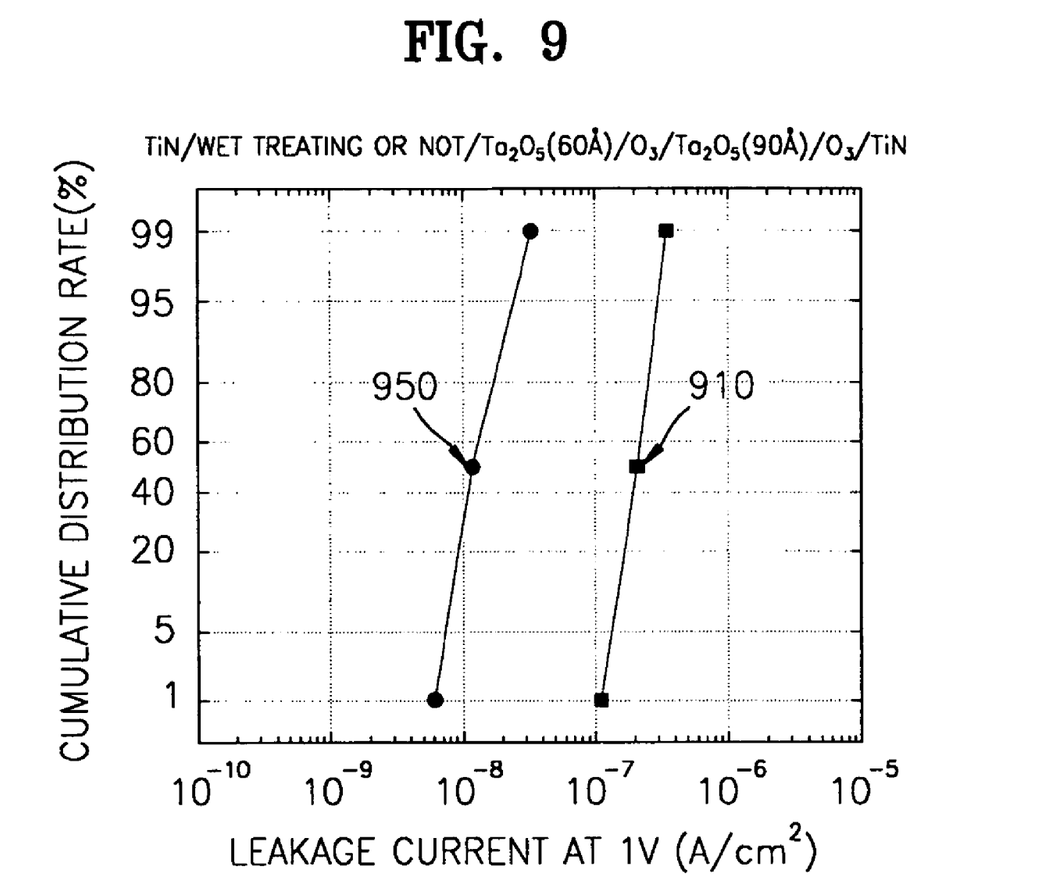

FIG. 9 is a graph showing drop in leakage current of a capacitor according to the embodiment of the present invention in which a wet treatment using ozone water is performed on the capacitor.

The results of FIG. 9 show measured leakage current of sample capacitors, which were formed by forming a TiN lower electrode, wet treating or not, forming a 60-Å thick $Ta_2O_5$ layer, $O_3$-annealing, forming a 60-Å thick $Ta_2O_5$ layer, $O_3$-annealing, and forming a TiN upper electrode. The wet treatment was performed using ozone water. As shown in FIG. 9, leakage current in case 950 where the wet treatment using ozone water was performed for about 180 seconds was between one and two orders of magnitude less than that in case 910 where the wet treatment was not performed.

Referring to FIGS. 8 and 9, the wet treatment using ozone water has almost the same effects as the $H_2SO_4$ wet treatment. Nevertheless, considering the time taken for the wet treatment, the wet treatment using ozone water is more efficient in the mass production of semiconductor devices. Also, disposal of $H_2SO_4$ waste materials may come into a serious question, whereas ozone water is more environmentally friendly. Accordingly, using the ozone water in the manufacture of semiconductor devices is preferred.

The wet treatment using $H_2SO_4$ or ozone water results in removal of surface organic materials, which may exist on the surface of the lower metal electrode. This is because a chemical oxide layer, an active layer, is formed on the surface of the lower metal electrode due to the wet treatment using $H_2SO_4$ or ozone water.

As shown in FIGS. 7 through 9, by the multi-stepped wet treatment of the present invention using $H_2SO_4$ or ozone water, the characteristics of the capacitor were improved. Here, factors affecting the characteristics of the capacitor are not limited to organic materials and oxides that may exist on the surface of the lower metal electrode. For example, particles also are the important cause of capacitor degradation.

In particular, the generation of the particles may be a serious issue when chemical mechanical polishing (CMP) is used to separate the lower metal electrodes. The CMP process is generally performed to planarize or etch back the sacrificial layer (400 of FIGS. 2 and 3) and/or to separate the lower metal electrode layer (310 of FIG. 2). However, the CMP process involves generation of particles due to polishing slurry and polishing byproduct. Accordingly, the particles also should be removed by the multi-stepped wet treatment of the lower metal electrode.

According to experimental results, although the SC1 or HF is effective in removal of the surface oxides, the LAL is most effective in removal of particles. The HF is effective in removal of the surface oxides, such as native oxide, but is not very useful for removal of the particles. The following photographs of FIGS. 10 and 11 shows the experimental results.

Figure 10:
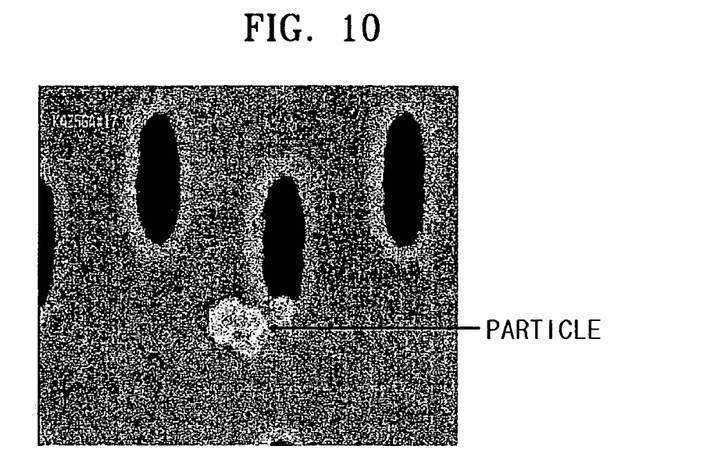
FIGS. 10 and 11 are photographs of a capacitor manufactured according to the method of the present invention in which a multi-stepped wet treatment is performed showing that particles are effectively removed from the capacitor.

FIG. 10 is a scanning electron microscope (SEM) photograph showing results of an HF wet treatment.

Figure 11:
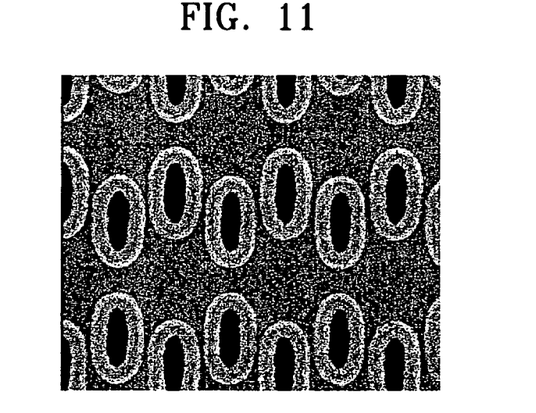

FIG. 11 is a SEM photograph showing the results of a LAL wet treatment.

FIGS. 10 and 11 are photographs of a capacitor in which a wet treatment is performed on the lower metal electrode. Initially, as shown in FIG. 10, even in the case where the HF wet treatment was performed, particles remained. On the other hand, as shown in FIG. 11, when the LAL wet treatment was carried out, the particles were effectively removed.

Accordingly, considering the need for removal of the particles, the LAL wet treatment should be added to the multi-stepped wet treatment according to the embodiment of the present invention.

However, under certain circumstances, the LAL wet treatment may cause some side effects, for example, water marks.

Figure 12:
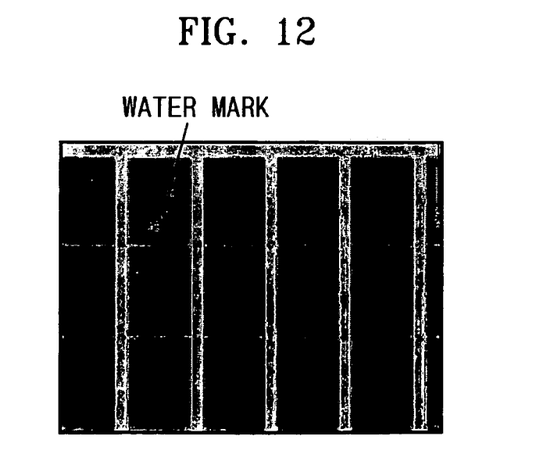
FIG. 12 is a photograph of a capacitor manufactured in accordance with the method of the present invention in which a multi-stepped wet treatment is performed showing that no water marks are formed in the capacitor.

FIG. 12 is a photograph showing the results of a LAL wet treatment.

As shown in FIG. 12, after the LAL wet treatment is carried out without any follow-up measures, when the lower metal electrode is dried, water marks often occur. The water marks, which adversely affect yield of the semiconductor devices, should be minimized.

As the result of various experiments, it was found that the generation of water marks by the LAL wet treatment could be effectively prevented if an HF wet treatment was performed prior to the LAL wet treatment. Therefore, if generation of particles becomes a serious issue, for example, if a CMP process is performed to separate the lower metal electrode layer 310, the multi-stepped wet treatment of the lower metal electrode preferably comprises the HF wet treatment followed by the LAL wet treatment.

Figure 13:
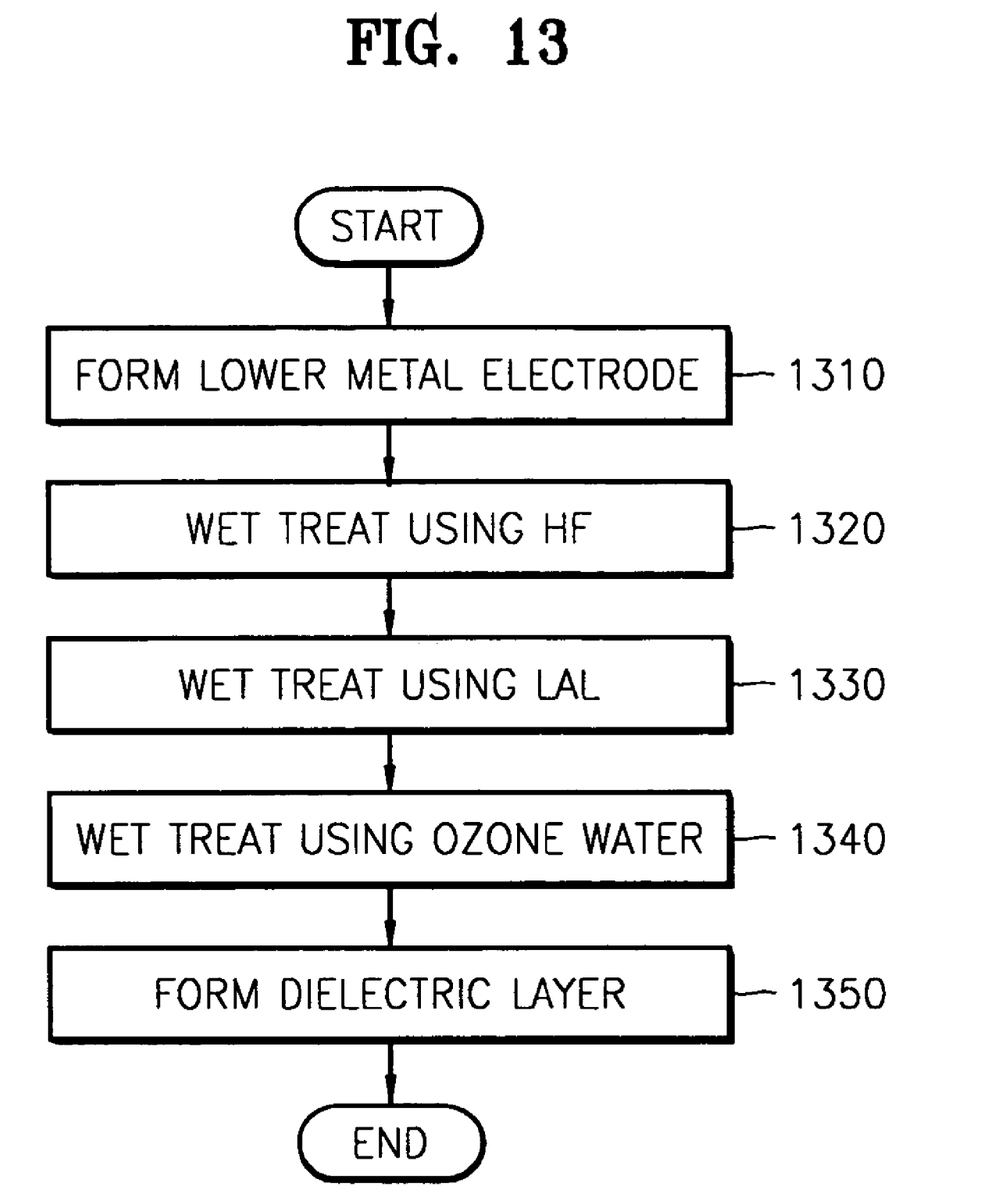
FIG. 13 is a flowchart illustrating a multi-stepped wet treatment according to the embodiment of the present invention.

The embodiment of the present invention, which is embodied based on the experimental results shown in FIGS. 7 through 12, can, for example, follow the process steps shown in FIG. 13.

FIG. 13 is a flowchart illustrating a multi-stepped wet treatment according to the embodiment of the present invention.

Referring to FIG. 13, a lower metal electrode is formed (step 1310), and then an HF wet treatment is performed (step 1320). The HF wet treatment can be performed using HF diluted with DIW in a ratio of about 1:200 for about 1 to 10 minutes. The HF wet treatment is carried out in order to remove mainly surface oxides such as native oxide, which are generated on the surface of the lower metal electrode.

Thereafter, a LAL wet treatment is carried out (step 1330). An etchant mixture of $NH_4F$ and HF is diluted with DIW and used for the LAL wet treatment. Here, the LAL wet treatment is carried out for about 5 to 50 seconds. As described above, the LAL wet treatment effectively removes not only the surface oxides but also particles. Here, the previous HF wet treatment (step 1320) can effectively prevent generation of water marks, which may be involved by the LAL wet treatment.

Thereafter, a wet treatment using ozone water is carried out (step 1340). Although this wet treatment using ozone water may be replaced by a $H_2SO_4$ wet treatment (in this case, $H_2O_2$ diluted with DIW may be added), the wet treatment using ozone water is more useful and effective as described above. By the wet treatment using ozone water (or $H_2SO_4$ wet treatment) (step 1340), unnecessary surface oxides and organics can be removed from the surface of the metal electrode and an active chemical oxide layer can be generated on the surface of the metal electrode. When the dielectric layer is formed using a high-k dielectric material, the chemical oxide layer is used to improve the characteristics of the high-k dielectric layer.

After the foregoing multi-stepped wet treatment is performed, a dielectric layer is formed (step 1350).

According to the present invention, a multi-stepped wet treatment is applied to the surface of a lower metal electrode in order to improve interfacial characteristics between the lower metal electrode and a dielectric layer. Thus, the performance characteristics, most notably, the leakage current characteristic, of an MIM capacitor can be effectively improved.

While the present invention has been particularly shown and described with reference to a preferred embodiment thereof, it will be understood by those of ordinary skill in the art that various changes in form and detail may be made herein without departing from the spirit and scope of the present invention as defined by the following claims.

What is claimed is:

1. A method of manufacturing a capacitor, the method comprising:
    forming a lower metal electrode of a capacitor;
    performing a primary wet treatment on a surface of the lower metal electrode to remove unwanted surface oxides from the surface of the lower metal electrode;
    performing a secondary wet treatment on the surface of the lower metal electrode by using a different etchant than an etchant used in the primary wet treatment to remove unwanted surface organic materials from the surface of the lower metal electrode, wherein the secondary wet treatment is performed using an etchant containing ozone water;
    forming a dielectric layer on the lower metal electrode using a high-k dielectric material; and
    forming an upper metal electrode on the dielectric layer.

2. The method of claim 1, wherein the lower metal electrode is formed of one selected from to group consisting of titanium nitride, tantalum nitride, tungsten nitride, platinum, and ruthenium or a combination thereof, and wherein to upper metal electrode is formed of one selected from the group consisting of titanium nitride, tantalum nitride, tungsten nitride, platinum, and ruthenium or a combination thereof.

3. The method of claim 1, wherein the lower metal electrode and the upper metal electrode are formed of titanium nitride.

4. The method of claim 1, wherein the primary wet treatment is performed using an etchant containing one selected from the group consisting of HF, LAL, and SC1, or a combination thereof.

5. A method of manufacturing a capacitor, the method comprising:
    forming a lower metal electrode of a capacitor;
    performing a primary wet treatment on a surface of the lower metal electrode;
    performing a secondary wet treatment on the surface of the tower metal electrode using an etchant containing LAL;
    performing a third wet treatment on the surface of the lower metal electrode using an etchant containing ozone water;
    forming a dielectric layer on the surface of the lower metal electrode using a high-k dielectric material; and
    forming an upper metal electrode on the dielectric layer.

6. The method of claim 5, wherein the lower metal electrode and the upper metal electrode are formed of titanium nitride.

7. The method of claim 5, wherein the forming of the lower metal electrode comprises:
    forming a molding layer;
    forming a mold having a recess by patterning the molding layer;
    forming a lower metal electrode layer having a recess along an inner surface of the recess of the mold;
    forming a sacrificial layer to fill the recess of the lower metal electrode layer;
    forming the lower metal electrode by separating the lower metal electrode layer by
    planarizing the sacrificial layer and the lower metal electrode layer until a top surface of the mold layer is exposed; and
    selectively removing a remaining portion of the sacrificial layer.

8. The method of claim 7, wherein the separation of the lower metal electrode layer comprises planarizing the lower metal electrode layer using chemical mechanical polishing.

9. The method of claim 5, wherein the primary wet treatment is performed for about 1 minute to 10 minutes using as an etchant a HF diluted with deionized water in a ratio of 1:200.

10. The method of claim 5, wherein the secondary wet treatment is performed for about 5 seconds to 50 seconds.

11. A method of manufacturing a capacitor, the method comprising:
    forming a lower metal electrode of a capacitor;
    performing a primary wet treatment on a surface of the lower metal electrode using an etchant containing HF;
    performing a secondary wet treatment on the surface of the lower metal electrode using an etchant containing LAL;
    performing a third wet treatment on the surface of the lower metal electrode using an etchant containing $H_2SO_4$;
    forming a dielectric layer on the lower metal electrode using a high-k dielectric material; and
    forming an upper metal electrode on the dielectric layer.

12. The method of claim 11, wherein the lower metal electrode and the upper metal electrode are formed of titanium nitride.

13. The method of claim 11, wherein the third wet treatment is performed using the $H_2SO_4$-containing etchant further containing $H_2O_2$ at a temperature ranging from about 70° C. to 90° C.

14. A method of manufacturing a capacitor, the method comprising:
    forming a lower metal electrode of a capacitor;
    performing a primary wet treatment on a surface of the lower metal electrode to remove unwanted surface oxides from the surface of the lower metal electrode, wherein the primary wet treatment is performed using an etchant containing one selected from the group consisting of HF, LAL, and SC1, or a combination thereof;
    performing a secondary wet treatment on the surface of the lower metal electrode by using a different etchant than the etchant used in the primary wet treatment to remove unwanted surface organic materials from the surface of the lower metal electrode, wherein the secondary wet treatment is performed using an etchant containing ozone water;

forming a dielectric layer on the lower metal electrode using a high-k dielectric material; and forming an upper metal electrode on the dielectric layer.

15. The method of claim 14, wherein the lower metal electrode is formed of one selected from the group consisting of titanium nitride, tantalum nitride, tungsten nitride, platinum, and ruthenium or a combination thereof, and wherein the upper metal electrode is formed of one selected from the group consisting of titanium nitride, tantalum nitride, tungsten nitride, platinum, and ruthenium or a combination thereof.

16. The method of claim 14, wherein the lower metal electrode and the upper metal electrode are formed of titanium nitride.

17. The method of claim 14, wherein the SC1 is used as an etchant at a temperature ranging from about 30° C. to 50° C.

18. A method of manufacturing a capacitor, the method comprising:

forming a lower metal electrode of a capacitor;

performing a primary wet treatment on a surface of the lower metal electrode to remove unwanted surface oxides from the surface of the lower metal electrode, wherein the primary wet treatment is performed using an etchant containing LAL;

subsequent to performing the primary wet treatment, performing a secondary wet treatment on the surface of the lower metal electrode by using a different etchant than the etchant used in the primary wet treatment to remove a remaining residue of unwanted surface oxides and unwanted surface organic materials from the surface of the lower metal electrode, wherein the secondary wet treatment is performed using an etchant containing $H_2SO_4$;

forming a dielectric layer on the lower metal electrode using a high-k dielectric material; and forming an upper metal electrode on the dielectric layer.

19. The method of claim 18, wherein the lower metal electrode is formed of one selected from the group consisting of titanium nitride, tantalum nitride, tungsten nitride, platinum, and ruthenium or a combination thereof, and wherein the tipper metal electrode is formed of one selected from the group consisting of titanium nitride, tantalum nitride, tungsten nitride, platinum, and ruthenium or a combination thereof.

20. The method of claim 18, wherein the lower metal electrode and the upper metal electrode are formed of titanium nitride.

21. The method of claim 18, wherein the etchant containing $H_2SO_4$ used for the secondary wet treatment further contains $H_2O_2$.

22. A method of manufacturing a capacitor, the method comprising:

forming a lower metal electrode of a capacitor;

performing a primary wet treatment on an entire upper surface of the lower metal electrode to remove unwanted surface oxides from the surface of the lower metal electrode, wherein the primary wet treatment is performed using an etchant containing SC1;

subsequent to performing the primary wet treatment, performing a secondary wet treatment on the entire upper surface of the lower metal electrode by using a different etchant than an etchant used in the primary wet treatment to remove a remaining residue of unwanted surface oxides and unwanted surface organic materials from the surface of the lower metal electrode, wherein the secondary wet treatment is performed using an etchant containing $H_2SO_4$;

forming a dielectric layer an the lower metal electrode using a high-k dielectric material; and forming an upper metal electrode on the dielectric layer.

23. The method of claim 22, wherein the lower metal electrode is formed of one selected from the group consisting of titanium nitride, tantalum nitride, tungsten nitride, platinum, and ruthenium or a combination thereof, and wherein the upper metal electrode is formed of one selected from the group consisting of titanium nitride, tantalum nitride, tungsten nitride, platinum, and ruthenium or a combination thereof.

24. The method of claim 22, wherein the lower metal electrode and the upper metal electrode are fanned of titanium nitride.

25. The method of claim 22, wherein the etchant containing $H_2SO_4$ used for the secondary wet treatment further contains $H_2O_2$.

26. The method of claim 22, wherein the SC1 is used as an etchant at a temperature ranging from about 30° C. to 50° C.

* * * * *

UNITED STATES PATENT AND TRADEMARK OFFICE
CERTIFICATE OF CORRECTION

| | |
|---|---|
| PATENT NO. | : 7,008,837 B2 |
| APPLICATION NO. | : 10/776053 |
| DATED | : March 7, 2006 |
| INVENTOR(S) | : Seok-jun Won et al. |

It is certified that error appears in the above-identified patent and that said Letters Patent is hereby corrected as shown below:

At Column 10, Claim 13, Line 53, delete "." after the first occurrence of "C".

At Column 11, Claim 17, Line 19, delete "." after "C".

At Column 11, Claim 19, Line 45, delete "tipper" and insert --upper--.

At Column 12, Claim 24, Line 39, delete "fanned" and insert --formed--.

At Column 12, Claim 26, Line 45, delete "." after "C".

Signed and Sealed this

Twenty-fifth Day of July, 2006

JON W. DUDAS
*Director of the United States Patent and Trademark Office*